(12) United States Patent (10) Patent No.: US 7,643,505 B1
Colloff                                  (45) Date of Patent:          Jan. 5, 2010

(54) METHOD AND SYSTEM FOR REAL TIME COMPRESSION AND DECOMPRESSION

(75) Inventor: Ian G. Colloff, Los Gatos, CA (US)

(73) Assignee: QLOGIC, Corporation, Aliso Viejo, CA (US)

( * ) Notice: Subject to any disclaimer, the term of this patent is extended or adjusted under 35 U.S.C. 154(b) by 349 days.

(21) Appl. No.: 11/565,444

(22) Filed: Nov. 30, 2006

(51) Int. Cl.
H04L 12/54 (2006.01)
(52) U.S. Cl. .................................. 370/422; 370/418
(58) Field of Classification Search ................ 370/273, 370/280, 422, 418, 420, 390, 563, 565
See application file for complete search history.

(56) References Cited
U.S. PATENT DOCUMENTS 5,684,954 A * 11/1997 Kaiserswerth et al. ...... 709/236
5,835,730 A * 11/1998 Grossman et al. ........... 709/247
2005/0071151 A1* 3/2005 Adl-Tabatabai et al. ....... 704/10
2006/0059196 A1* 3/2006 Sato et al. ................ 707/104.1

* cited by examiner

*Primary Examiner*—Dang T Ton
*Assistant Examiner*—Nourali Mansoury
(74) *Attorney, Agent, or Firm*—Klein, O'Neill & Singh, LLP

(57) ABSTRACT

Method and system for compressing a data packet is provided. The method includes receiving a data packet; comparing the data packet with content stored in a history module; wherein plural comparisons are performed in parallel; generating a plurality of masks based on the comparisons; comparing the plurality of masks; selecting one of the plurality of masks, based on the mask comparison; and generating a compression record, wherein the compression record includes; size of a data packet, an address field, a mask field and data; and a data packet header includes a control bit indicating if the data packet is compressed.

22 Claims, 10 Drawing Sheets

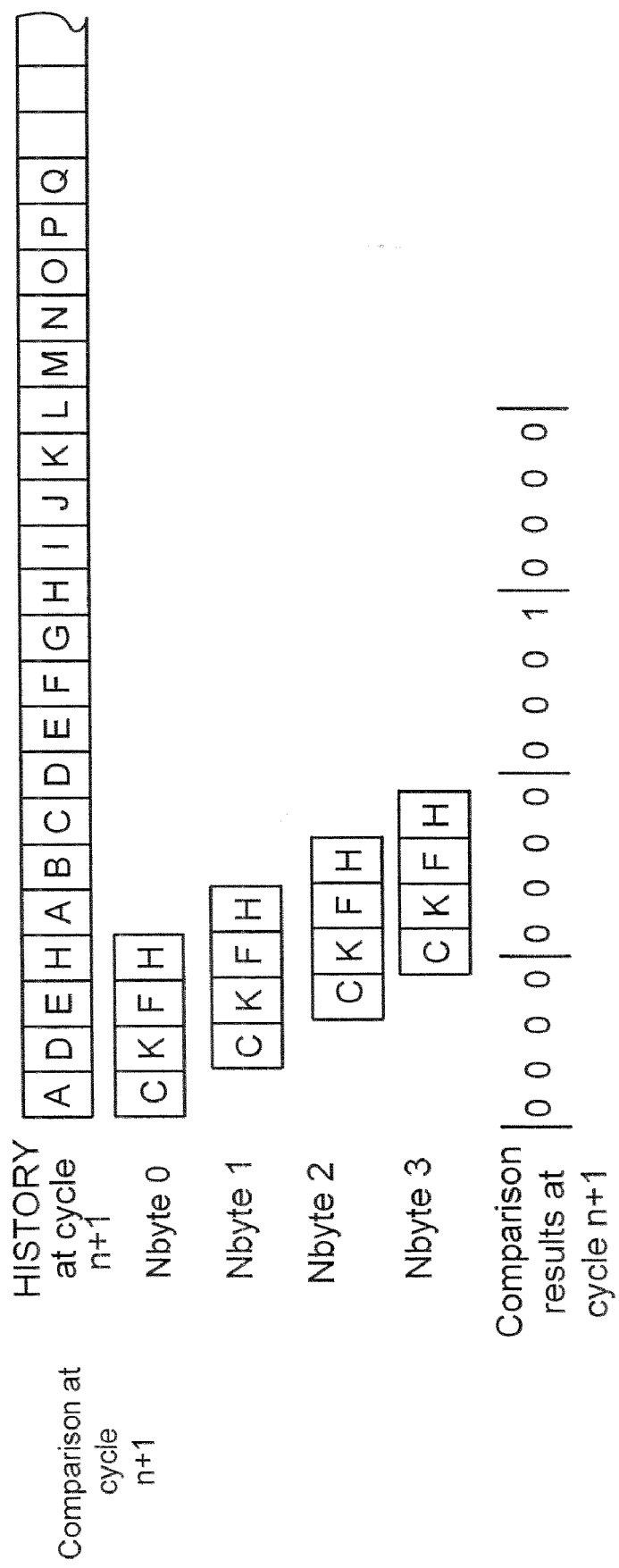

METHOD AND SYSTEM FOR REAL TIME COMPRESSION AND DECOMPRESSION

BACKGROUND

1. Field of the Invention

The present invention relates to networks, and more particularly to compression methods and systems for network communication.

2. Background of the Invention

Networks are commonly used to move information (includes data and commands). Networks may develop congestion when various devices and computing systems attempt to access and use shared resources. Data compression may be employed to better utilize network and storage resources.

Network links operate at high speeds (for example, 80 Gbps). One challenge with such high speeds is that it makes it difficult to compress data in "real-time" (or wire-speed, a speed at which a link is operating). Therefore, there is a need for a method and system to achieve compression in real time.

SUMMARY OF THE PRESENT INVENTION

In one aspect, a method for compressing a data packet is provided. The method includes receiving a data packet; comparing the data packet with content stored in a history module; wherein plural comparisons are performed in parallel; generating a plurality of masks based on the comparisons; comparing the plurality of masks; selecting one of the plurality of masks, based on the mask comparison; and generating a compression record, wherein the compression record includes; size of a data packet, an address field, a mask field and data; and a data packet header includes a control bit indicating if the data packet is compressed.

In another aspect, a compression module for compressing a data packet is provided. The compression module includes an input buffer for receiving a data packet; a compare module for comparing the data packet with content stored in a history module; wherein plural comparisons are performed in parallel; and generating a plurality of masks based on the comparisons; and a compression engine for comparing the plurality of masks and selecting one of the plurality of masks, based on the mask comparison; and generating a compression record, wherein the compression record includes; size of a data packet, an address field, a mask field and data; and a data packet header includes a control bit indicating if the data packet is compressed.

In yet another aspect, a method for decompressing a data packet is provided. The method includes receiving a data packet; determining if the data packet is compressed; retrieving a compression record, if the data packet is compressed; extracting data that had matches using an address and mask information; and merging matched data with unmatched data for generating a decompressed packet.

This brief summary has been provided so that the nature of the invention may be understood quickly. A more complete understanding of the invention can be obtained by reference to the following detailed description of the preferred embodiments thereof concerning the attached drawings.

BRIEF DESCRIPTION OF THE DRAWINGS

The foregoing features and other features of the present invention will now be described with reference to the drawings of a preferred embodiment. In the drawings, the same components have the same reference numerals. The illustrated embodiment is intended to illustrate, but not to limit the invention. The drawings include the following Figures:

FIGS. 4A and 4B illustrate a comparison step, according to one aspect of the present invention;

DETAILED DESCRIPTION

In one aspect, a system and method for real time compression is provided. Compression is performed at a high data rate by a data compression module (or unit) (may also be referred to as "compression module") that can compress/decompress data in real time. The compression module, as described below in detail, includes an input buffer, a history module, a compare module, and a compression engine. The compression module may be included in host bus adapters, host channel adapter, switches; routers or other components. The compression module may used in Fibre Channel, Ethernet (IP; iSCSI, etc), InfiniBand and other environments.

To facilitate an understanding of the preferred embodiment, the general architecture and operation of a network system will be described. The specific architecture and operation of the preferred embodiment will then be described with reference to the general architecture.

Figure 1A:
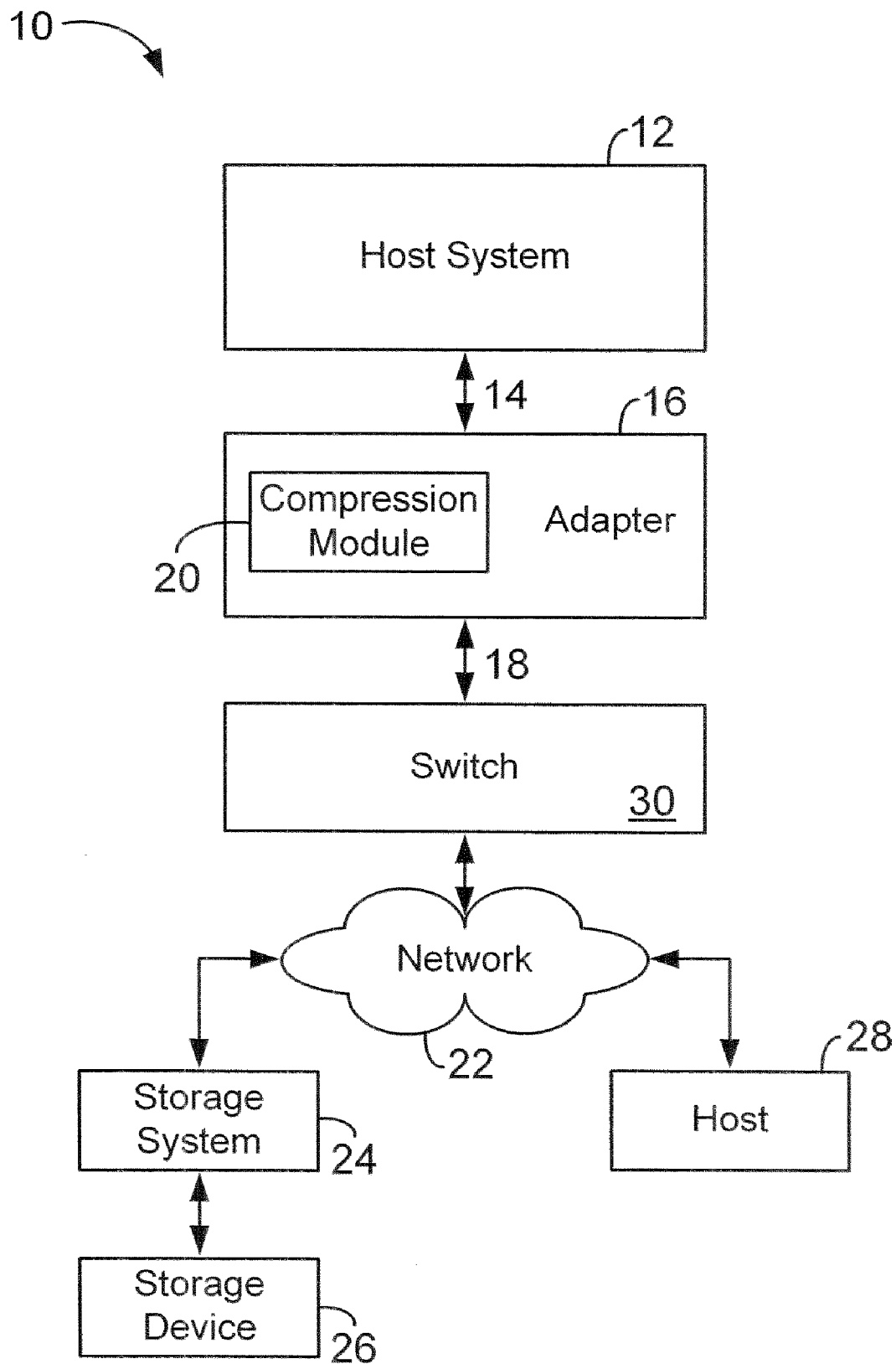
FIG. 1A shows a block diagram illustrating a storage area networking system that can be used for the adaptive aspects of the present invention.

FIG. 1A shows a top-level block diagram of a network system 10, according to one aspect of the present invention. System 10 facilitates compression and decompression of data packets, according to one aspect of the present invention.

System 10 includes a computing system 12 coupled to an adapter 16 via link/bus/channel (used interchangeably throughout this specification) 14. Computing system 12 typically includes several functional components. These components may include a central processing unit (CPU), main memory, input/output ("I/O") devices, and storage devices (for example, tape drives; hard disks and others).

The main memory is coupled to the CPU via a system bus or a local memory bus. The main memory is used to provide the CPU access to data and/or program information that is stored in main memory at execution time. Typically, the main memory is composed of random access memory (RAM) circuits. A computing system is often referred to as a host system Adapter 16 via a network link 18 couples host system 12 to a networking switch 30. Adapter 16 includes a compression and decompression module 20 (jointly referred to as "compression module" or "module" or "decompression module"

(20)) described below in detail. Adapter 16 may be a host bus adapter, host channel adapter, a network interface card or another similar device.

Switch 30 facilitates network communication via network (including storage area network (SAN)) 22 that includes storage system 24 with storage device 25 and host system 28. SANs are a type of network used to store and access data. A SAN maintains a sub-network of shared storage devices, for example, disks and tape drives. A host system can access data stored in the SAN.

Typical SAN architecture makes storage devices (for example, 26) available to all servers (for example, 12 and 28) that are connected using a computer network, for example, a local area network or a wide area network. The term server in this context means any computing system or device coupled to a network that manages network resources. For example, a file server is a computer and storage device dedicated to storing files. Any user on the network can store files on the server.

System 10 provides an example of an environment for using compression module 20. System 10 is not limited to any particular type and number of devices, network protocol or standard, or any bus standard and specifications.

Figure 1B:
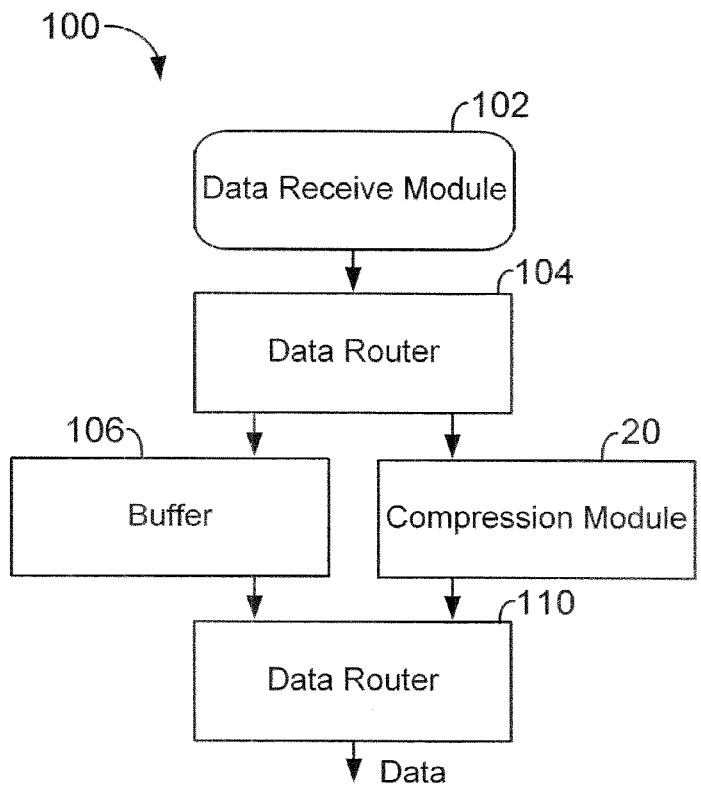
FIG. 1B shows a block diagram of a system using a compression module, according to an embodiment.

FIG. 1B shows a block diagram of another generic system 100, for using compression module 20. System 100 includes a data router 104 that receives data from a data receive module 102. Data receive module 102 may be placed at any network node that is involved in network communication. Data receive module 102 includes hardware/software to handle data that may be received from any source, for example, a host computing system or any other device.

Data router 104 determines whether data from data receive module 102 is to be compressed or decompressed, or is to be passed unchanged to link 18 via buffer 106 and data router 110. Data router 104 includes logic and software to perform this function. It is noteworthy that data router 104 can perform its functions in hardware, software or a combination thereof.

When data router 104 determines that a received data packet is to be compressed or uncompressed, it sends the packet to compression module 20, for processing (i.e. for compression or decompression). The processed data packet is then sent to another data router 110 and sent out via output link 18.

Data router 110 determines if compression was successful and sends the compressed data. If compression was unsuccessful, then uncompressed data is transmitted.

The term data router as used herein includes hardware, software, or a combination thereof, which moves data from one node, device or module to another node, device or module.

Figure 1C:
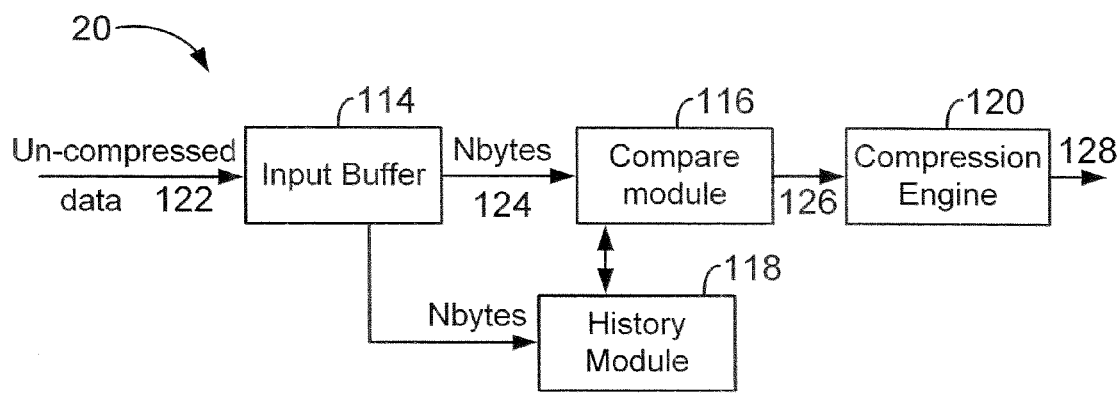
FIG. 1C shows a top-level block diagram of architecture of a compression module, according to an embodiment.

FIG. 1C shows a block diagram of compression module 20, according to one aspect of the present invention. Compression module 20 may be based in adapter 16 or any other location that needs to compress or de-compress data.

Compression module 20 includes an input buffer 114 that receives uncompressed data 122. Input buffer 114 includes memory storage space to hold data 122.

Output 124 from Input buffer 114 is sent to a compare module 116 and a history module 118. Output 124 is shown as N bytes, where N may be any number of bytes. Compare module 116 performs comparisons, as described below. History module 118 stores comparison records (also referred to as history records) and includes memory storage space, including registers.

Compare module 116 uses the N bytes for M comparisons, to generate N bit comparison masks. The M by N comparison masks together with the N bytes (jointly shown as 126) is forwarded to compression engine (or module) 120.

History Module 118 may initially have no data (or initialized to zeros). Hence, for the first N bytes there may be no matches. The comparison result is forwarded to compression engine 120. Compression engine 120 builds an uncompressed record. As described below, the record may include, for example, 2 bits of header information indicating uncompressed, N bytes of data.

When the N bytes are received, compare module 116 performs M by N comparisons. The N bytes received by history module 118 are held until the comparisons are complete, and then the N bytes are shifted into a lower segment (or address) of history module 118, moving out the oldest N bytes of the history record. This continues until there is no more data (12). A circular buffer type arrangement may be used where the latest N bytes overwrite the oldest N bytes in history module 118 and a start pointer is moved back N bytes. The adaptive aspects of the present invention are not limited to using a circular buffer type arrangement.

Compression engine 120 receives output 126 from compare module 116. Based on output 126, compression engine 120 generates a compression record 128, as described below.

Figure 2:
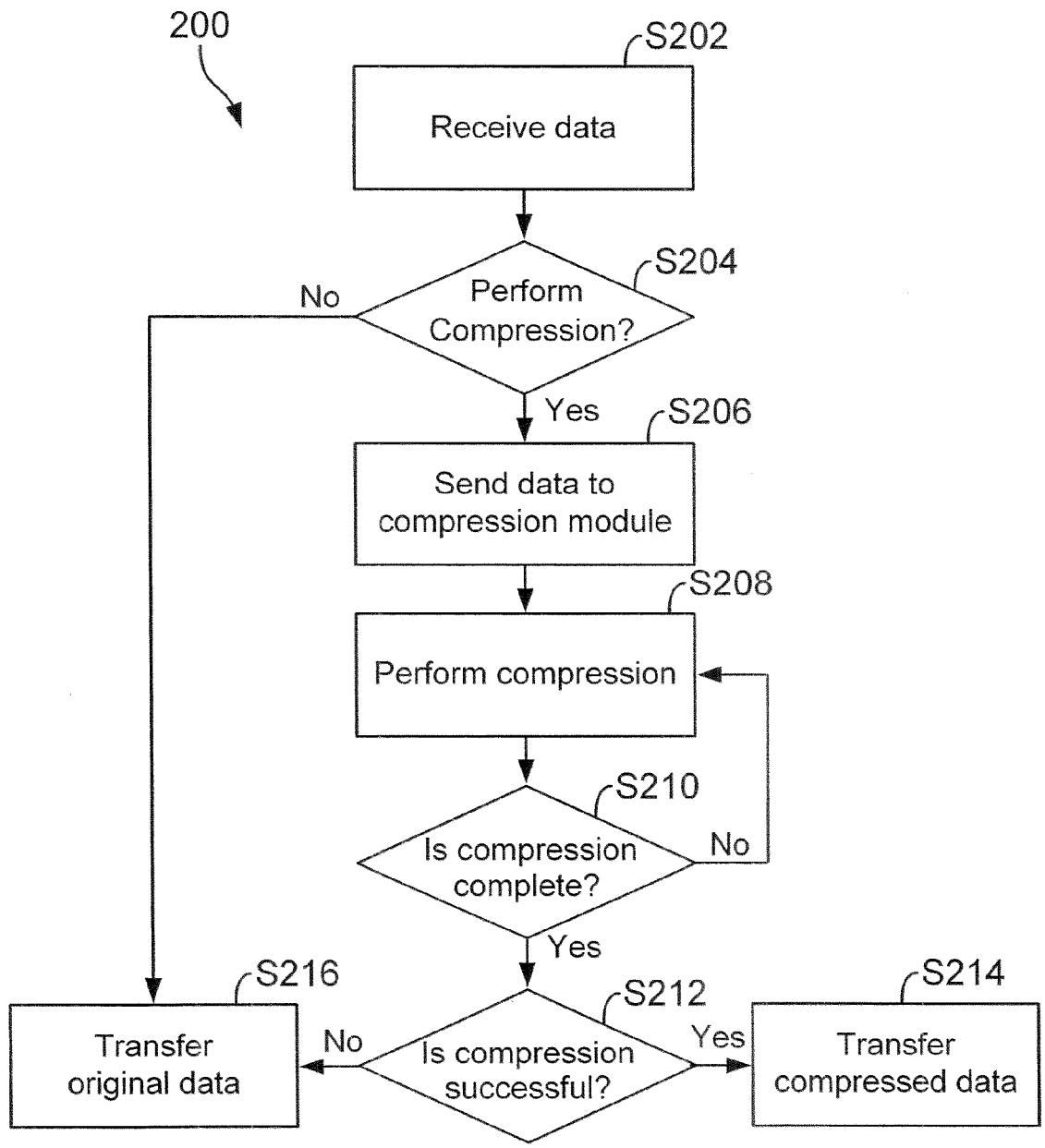
FIG. 2 is a flow diagram of an overall process for compressing data, according to an embodiment.

FIG. 2 shows a process flow diagram 200 for compressing data in real time, according to one aspect of the present invention. The process starts in step S202, when data (for example, 122, FIG. 1C) is received by data receive module 102. Data may be received from host system 12 or from any other device.

In step S204, data router 104 determines if data should be compressed. If data does not have to be compressed, then data 122 is routed to buffer 106 and transmitted in step S216.

If data has to be compressed, then in step S206, data is sent to compression module 20 for processing. The compression process is described below with respect to FIG. 3.

In steps S208, compression module 20 compresses data and verifies in step S210, if the compression is complete. If compression is complete, in step S212, the process determines whether the compression was successful. If compression is incomplete, then the process waits until the compression is completed in step S208.

If compression was successful, then compressed data is transferred in step S214, otherwise original data is transferred in step S216.

Various parameters may be used to ascertain if compression is successful. For example, compression may be deemed successful if compressed data is at least X % (for example, 1.5%) smaller than the original data. Table 1 below shows compression efficiency using different history record length for compressing 2 Kbytes and 8 Kbytes of data packets.

TABLE 1

| 16 Byte comparison record | Maximum Compressed Request rate/sec | Maximum Uncompressed Request rate/sec | Gain |
|---|---|---|---|
| 64 + 15 Byte history | | | |
| 8K Data packet | 248323 | 166600 | 1.490534 |
| 2K Data packet | 929281 | 637104 | 1.458602 |
| 128 + 15 Byte History | | | |
| 8K Data packet | 270672 | 166600 | 1.624682 |
| 2K Data packet | 1007252 | 637104 | 1.580985 |
| 256 + 15 Byte History | | | |
| 8K Data packet | 284357 | 166600 | 1.706825 |
| 2K Data packet | 1054073 | 637104 | 1.654476 |

Figure 3:
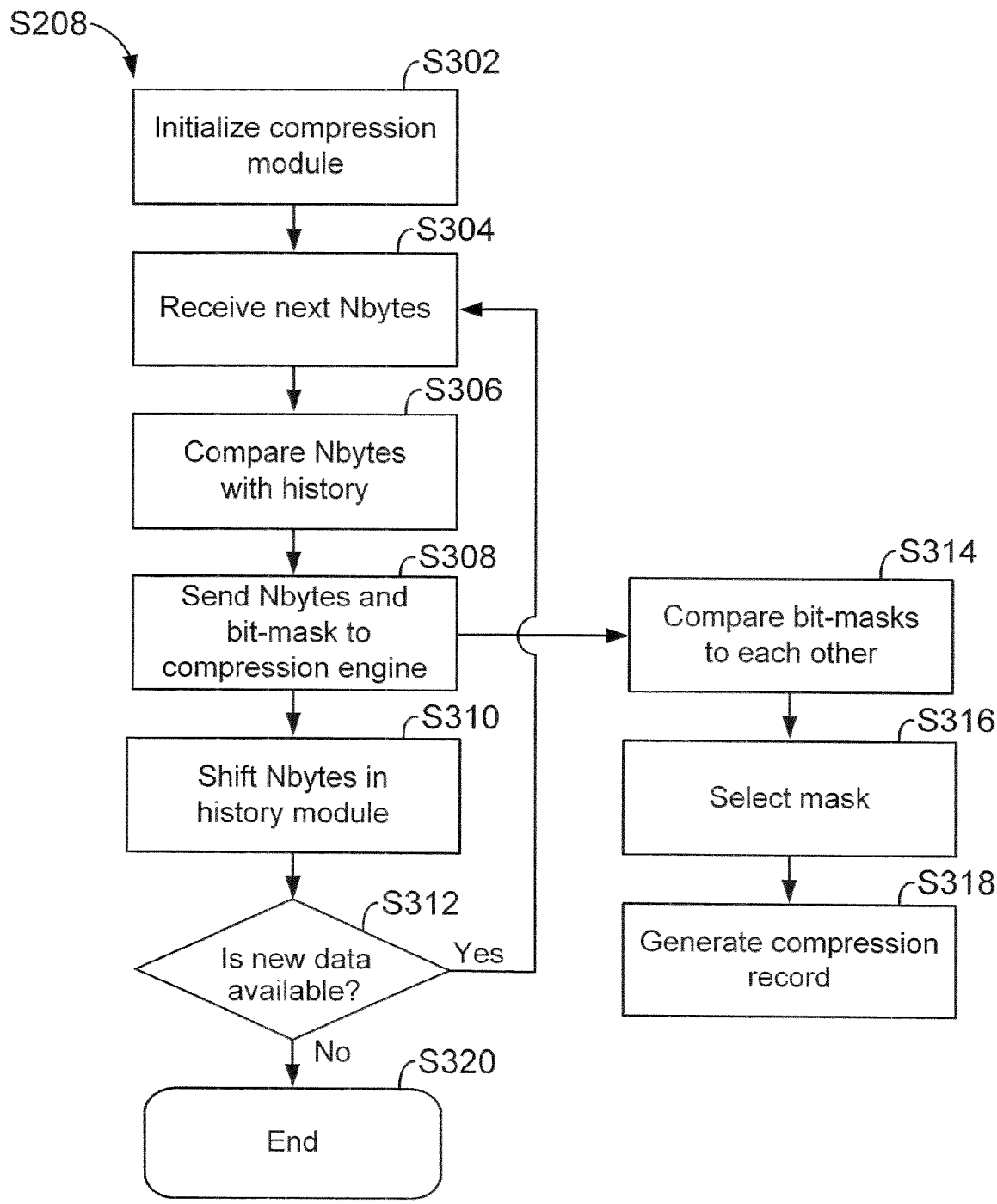
FIG. 3 is a flow diagram of a compression process, according to an embodiment.

FIG. 3 shows a detailed process flow diagram for compression step S208 of FIG. 2, according to one aspect of the present invention. The process starts in step S302, when compression module 20 is initialized.

In step 304, Nbytes are received and loaded into compare module 116. In step S306, compare module 116 compares a certain number of bytes, for example, N bytes, are compared with content stored in history module 118. The N bytes are compared M times in parallel, where N byte comparison starts at a next byte of the history record. The comparison generates a mask, which may be an N-bit mask.

In step S308, comparison results, mask addresses and the N bytes are sent to compression engine 110 and the process moves to step S314 described below.

In step S310, N byte comparison record is shifted so that the latest history record replaces the oldest history records. This allows history module 118 to be ready for the next N bytes that are received in step S304.

In step S312, the process determines if new data is available for compression. If new data is available, the process returns to step S304 (or step S302, if it is a new compression segment/unit) to receive the next N bytes, otherwise the process ends in step S320.

In step S314, all bit masks are compared to each other.

In step S316, a mask with most matches is selected. If there is more than one mask with the highest number of matches, then the match with the lowest memory address may be chosen.

In step 318, based on the selected mask, a compression record is generated. The compression record format is described below with respect to FIGS. 4D-4G.

Figure 4A:
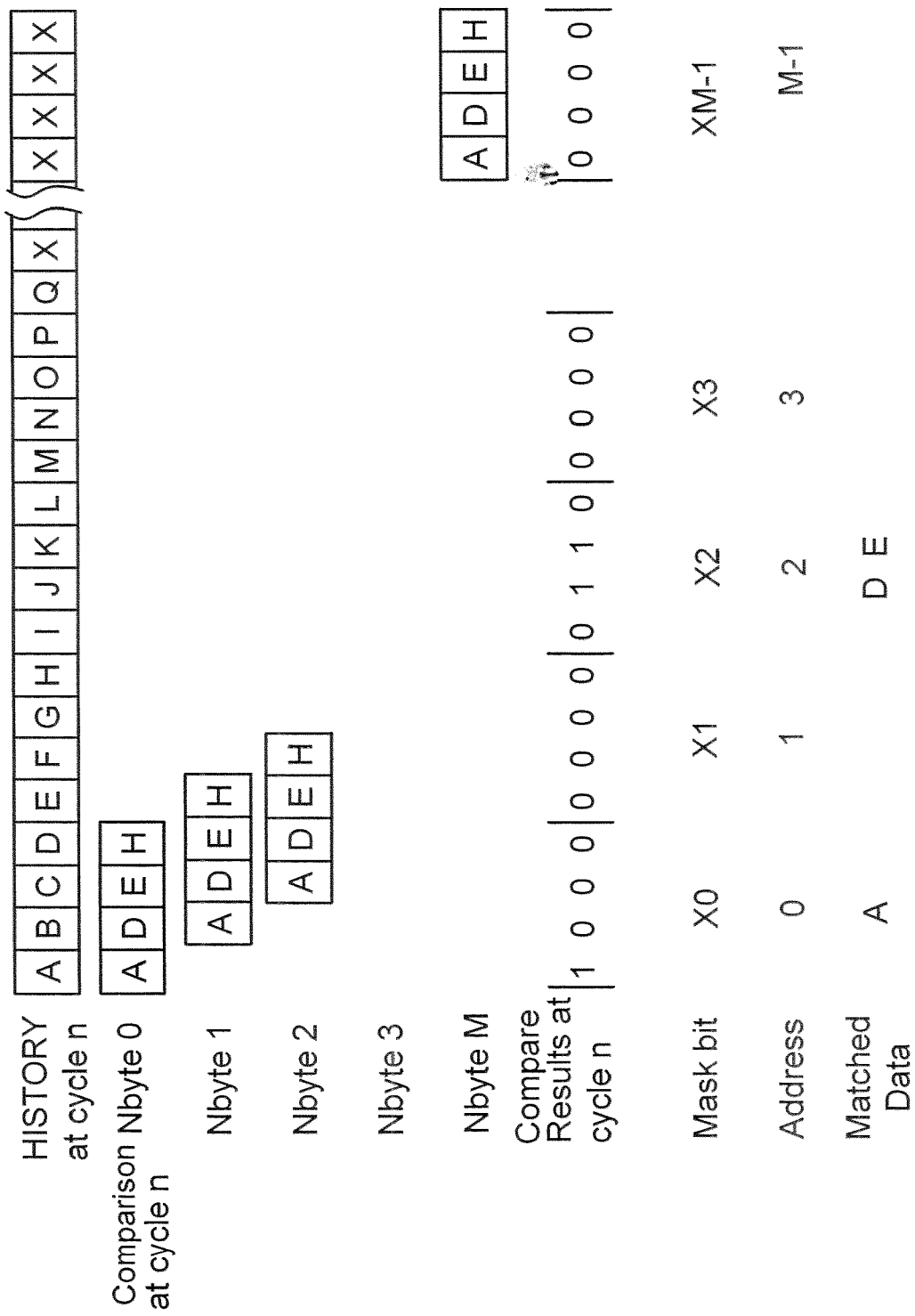

FIGS. 4A and 4B provide an example of compression step S208, according to one aspect of the present invention. In the FIG. 4A example, at any given time (cycle n) history module 118 stores certain number of bytes of data shown as ABCDEFGHIJKLMNOPQX.

4 bytes stored in history module 118 are compared to 4 bytes (Nbyte0=4 bytes) of incoming data. The adaptive aspects of the present invention are not based on any particular comparison size, and any other size, for example, 14, 16, 18, 28, 32 bytes or any other size may be used. With this arrangement, the comparison operation performs M simultaneous (i.e. in parallel) comparisons (each one shifted by a byte to cover the entire history stored in history module 118). The comparison produces M bit masks (shown as $X0, X1, X2$ and so forth) of 4 bits each.

In the FIG. 4A example, Nbyte$_0$ is ADEH, which are compared to ABCD, BCDE, CDEF, DEFG, EFGH and so forth. Masks $X_O$ to $X_{M-1}$ are generated. Mask address 0 to M−1 and data corresponding to the masks are also generated (or implied, depending on the implementation). Based on the example of FIG. 4A, the mask value for $X_0$ is 1000, $X_1$ is 0000, $X_2$ is 0110, $X_3$ is 0000, and so on. The matched data associated with mask $X_0$ is A, and matched data for mask $X_2$ is DE. There is no data corresponding to $X_1$ and $X_3$ since there was no match during a compare operation. After the comparison at time n, history module 118 is updated with incoming data ADEH, as shown in FIG. 4A.

FIG. 4B shows the data compare operation at cycle, n+1, i.e. the next cycle after n (shown in FIG. 4A). In this example, the first N bytes of history module 118 are ADEH, based on Nbyte$_0$ of FIG. 4A. During cycle n+1, the next data segment Nbyte$_{n+1}$ (CKEH) is compared with the updated history stored in history module 118.

After each comparison cycle the compare results are sent to compression engine 120 and a mask with the greatest number of matches is selected (S314 and S316). The operation to compare plural masks may use a binary tree based sorting scheme or any other method.

Figure 4C:
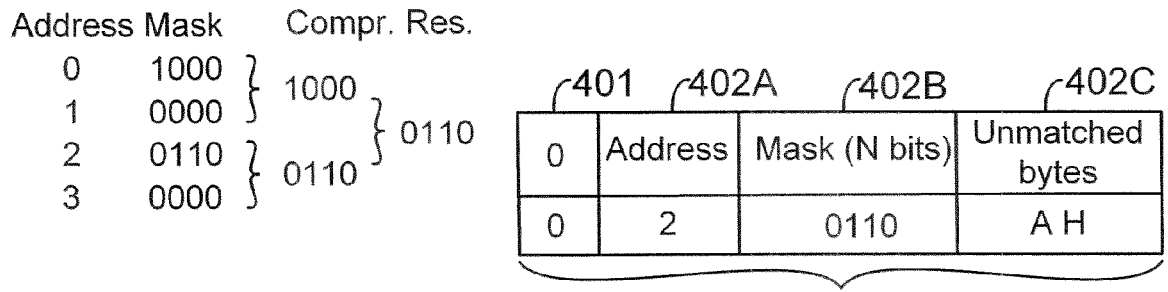
FIG. 4C provides an example of comparing bit masks, according to an embodiment.

FIG. 4C provides an example of comparing bit masks and representing compare and mask selection results. First mask $X_0$ (1000) is compared to mask $X_1$ (0000) and mask $X_o$ is selected. Thereafter, mask $X_2$ (0110) is compared to mask $X_3$ (0000), and mask $X_2$ is selected. Next mask $X_o$ (1000) is compared to mask $X_2$ (0110), and mask $X_2$ (0110) is selected because it has more matches. The selection process sorts through an entire mask set.

FIG. 4C also shows an example of a format 400 for presenting the mask selection results. Format 400 includes control bits 401, described below. The selected mask value is 0110 (402B) with an address 2 (402A) and mask associated data is AH (402C).

The size of history module 118 is set to achieve optimum compression result at high speeds. The following provides an example. If history module 118 were to include 256 bytes of history, address of 8 bits and the compare field size is 16 bytes, then history module 118 size may be 256+15 bytes=271 bytes. This allows 256 by 16 byte comparisons during a compression cycle. 16 bytes of oldest data are discarded at any given time and a current comparison record is shifted to the beginning of the history module 118 records; and a new cycle starts with a new 16-byte comparison.

Figure 4D:
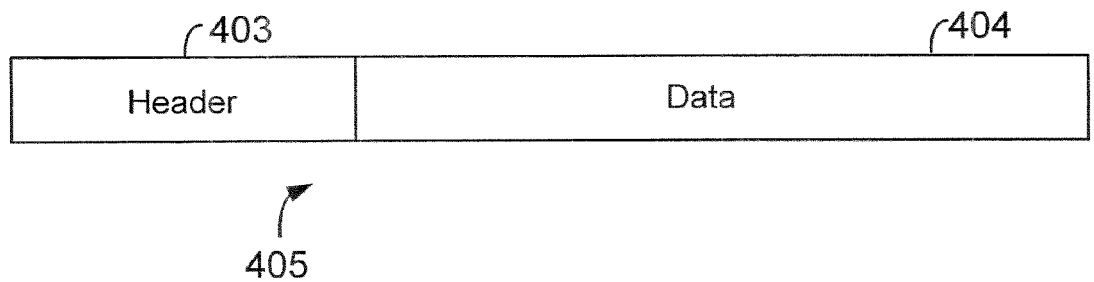
FIG. 4D illustrates a format of an uncompressed data packet.

FIG. 4D shows a conventional format 405 for an uncompressed data packet. Format 405 includes a header 403 and data 404. Header 403 content will depend on the protocol/standard that is being used for device and network communication. Conventional format 405 does not include a compression record that may be of variable length and provides compression information, according to one aspect of the present invention.

Figure 4E:
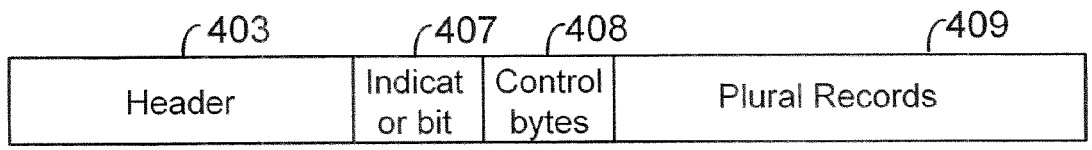
FIG. 4E illustrate a format for a compressed data packet, according to an embodiment.
Figure 4F:
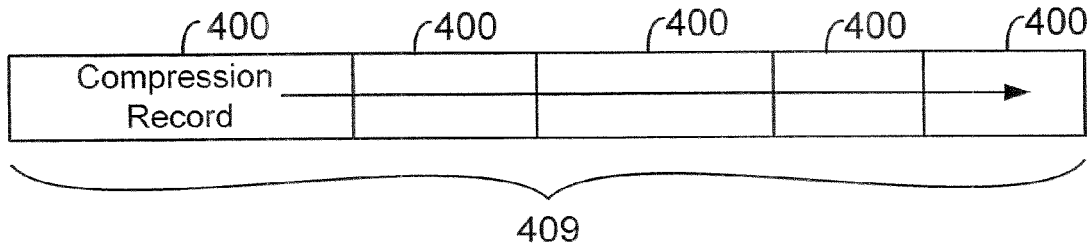
FIGS. 4F, 4G and 4H illustrate different formats for comparison records, according to an embodiment.

FIG. 4E shows an example of a new format 410 for a data packet, according to one aspect of the present invention. Format 410 includes a header field 403. Header 403 may include a bit value (compression indicator (shown as indicator bit) 407 whose value indicates whether a packet is compressed or not. For example, a control bit value of 1 may indicate that a packet is compressed and a bit value of 0 indicates that the packet in not compressed, and vice-versa. It is noteworthy that compression indicator bit value(s) 407 may be a part of header 403 or may be a separate field.

Format 410 also includes control byte(s) 408 that includes compression related information. Control byte (or bits) 408 includes compression information to de-compress compressed data at a node or device where compressed data is received. Control bytes 408 may also include cyclic redundancy code (CRC) for original uncompressed data. Alternatively, the CPC field may be placed at the end of a compressed data packet. CRC can be checked while data is being decompressed on a receive side. This may be a validity check for the compressed data.

Following control byte 408 are plural compression records shown as 409 in FIG. 4E. 409 includes plural compression records 400 (FIG. 4F) described below with respect to FIG. 4G and also shown in FIG. 4C. The number of compression records in 409 may be based on the size of data 404/N (the comparison size)+1.

Figure 4G:
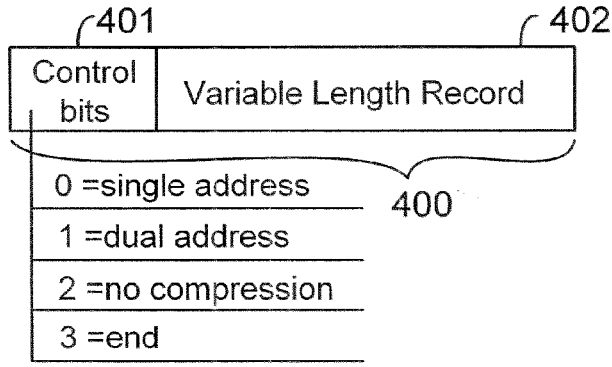

FIG. 4G shows an example of compression record 400 (same as 128) with various control bit 401 values, according to one aspect of the present invention. Control bits 401 may have the following values: 0=single address, 1=dual address 2=no compression and 3=end. Bit value 2 (no compression) is followed by N bytes of data; bit value 3 (End) is followed by length and the remaining bytes. If incoming data is a multiple of N then a length of zero will follow the "end".

Compression record 400 includes a variable length record 402 described below with respect to FIG. 4H.

Figure 4H:
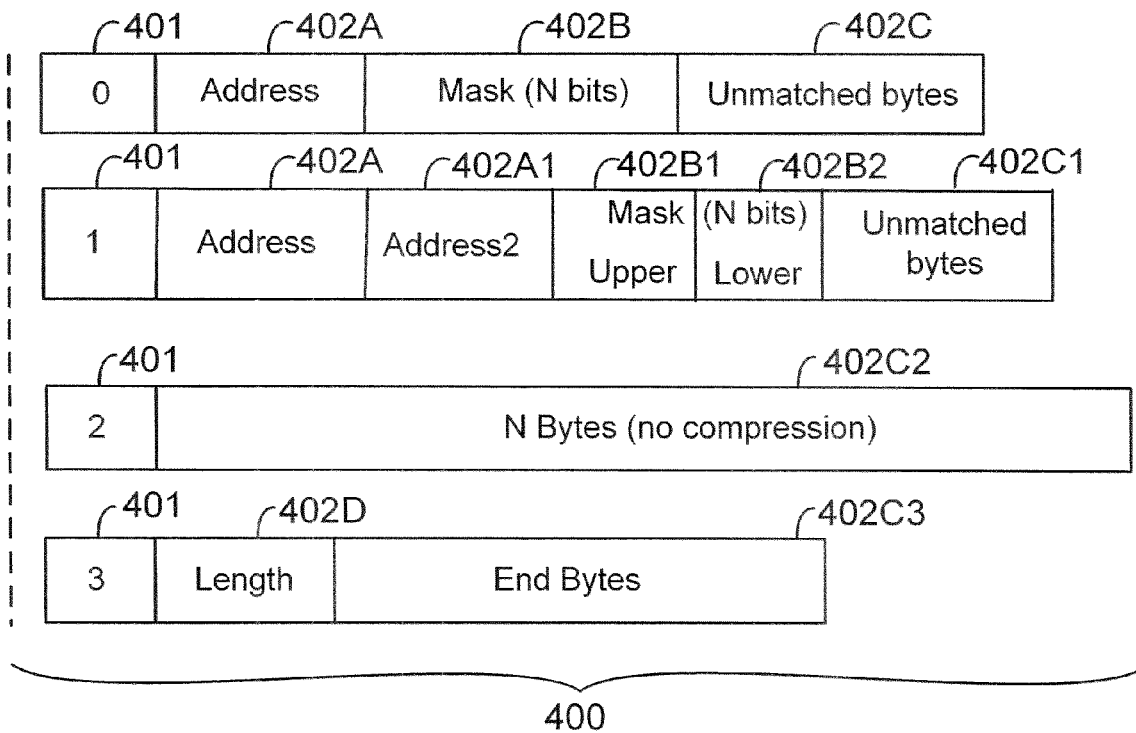

FIG. 4H shows different segments of variable length record 402 based on different control bit values. For example, when control bits 401 is equal to 0, variable length record 402 includes an address 402A, a mask 402B and unmatched bytes 402C. The mask field 402B provides information on history record matches and enables one to generate length of 402. The address field 402A provides an address for each mask. The field 402C provides the unmatched data information (i.e. data for which there is no match in the history module 118).

When control bits is equal to 1, plural addresses are used, for example, Address 1 (same as Address) (402A) and Address2 (402A1). Address 402A is applicable to mask 402B1, in which case when decompression is performed, mask 402B2 is set to zero (no match). Similarly the second address, 402A1 is applicable to mask 402B2 and during decompression, mask 402B1, is set to zero. The unmatched bytes in this case are shown as 402C1.

If the comparison results did not produce adequate compression, i.e. the number of matched bytes did not provide a smaller compression record, then an uncompressed record format may be used. Control bits set to 2 denotes an uncompressed record. The uncompressed data is shown as 402C2.

When control bits is set to 3, the compression record includes length 402D and end bytes 402C3. If data 404 is not a multiple of N, length 402D is denoted by $\log_2$ (N) (where if N is not a power of 2 it is rounded up to the next power of 2 for the calculation).

Figure 5:
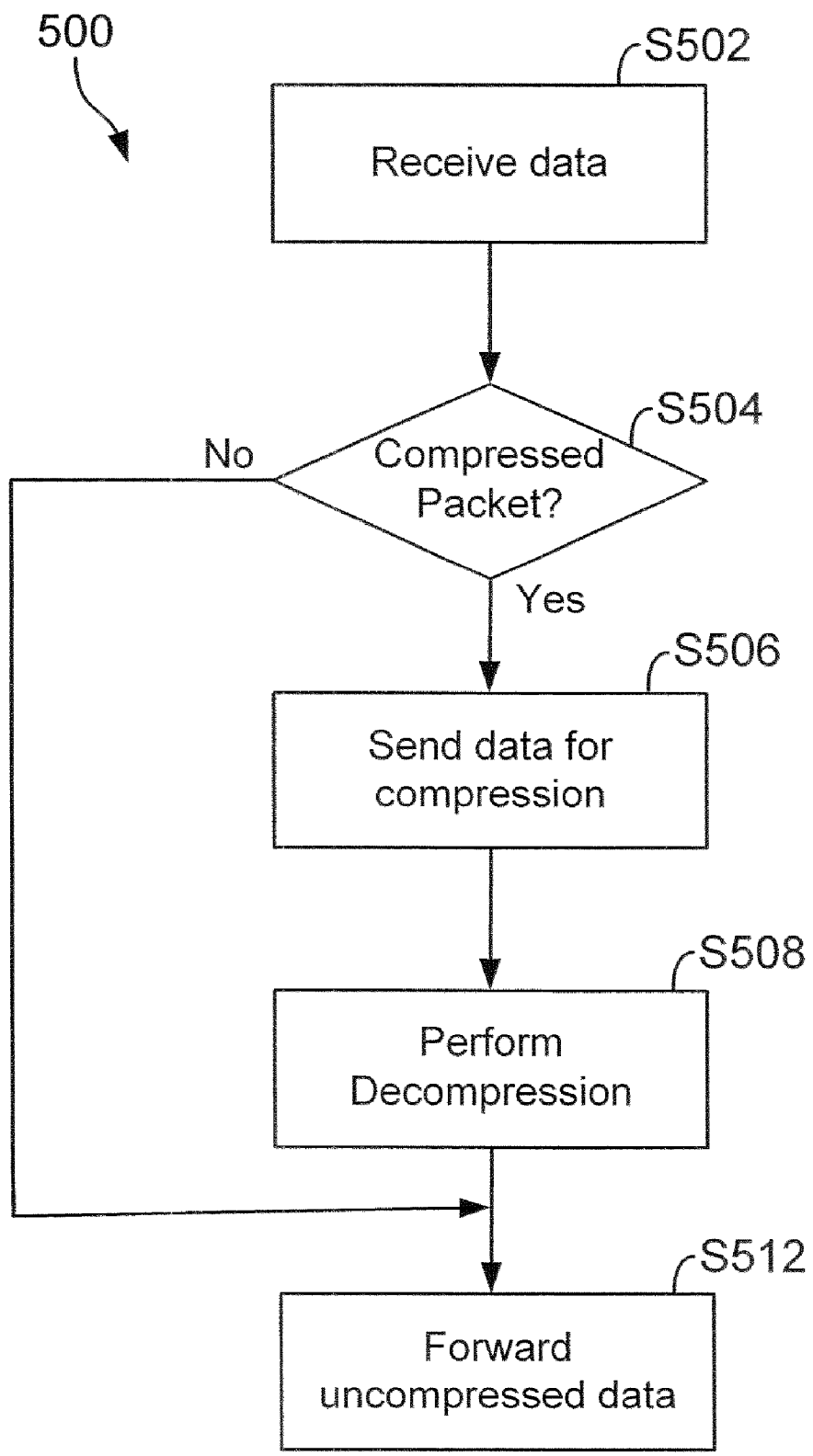
FIGS. 5 and 6 show flow diagrams for decompression, according to one embodiment.

Decompression:

FIG. 5 shows a top-level flow diagram 500 for decompressing data, according to one aspect of the present invention. The process starts in step S502, when a data packet is received by data receive module 102. In step S504, data router 104 determines if the received data packet is compressed. Compression indicator bit value (these are also control bits) 407 indicates if a data packet is compressed. If the packet is not uncompressed, then the process moves to step S512, as described below.

If the packet is compressed, then the data packet is sent to decompression module (in module 20) for decompression. Data is decompressed in step S508, as described below with respect to FIG. 6. Thereafter, in step S512, uncompressed data is forwarded to it's destination.

Figure 6:
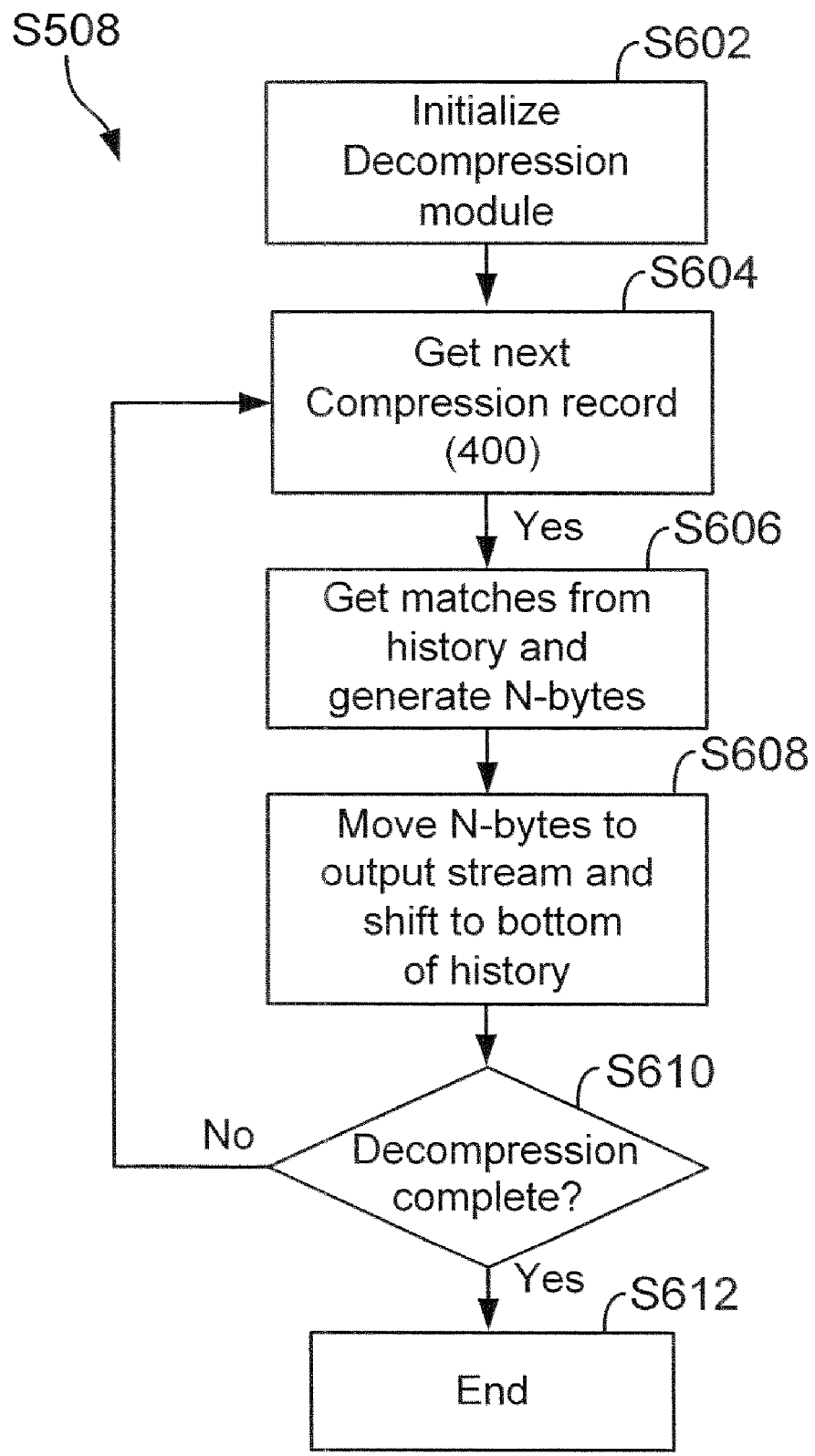

FIG. 6 shows a process flow diagram for decompression S508. In step S602, module 20 is initialized. Control bytes 408 are used to determine mask size and address size.

In step S604, module 20 retrieves a compression record (400) for a received data packet. In step S606, module 20 decompresses the record based on control bits 401. The address and the masks are used to extract data that had matches in the history record. The matched information is merged with unmatched information to generate the N bytes.

In step S608, the N bytes are moved to an output buffer. The N bytes are also shifted at the end of the history record displacing the oldest N bytes.

In step S610, module 20 determines if decompression is complete. If decompression is not complete, the process moves to step S604. If decompression is complete, then the process ends in step S612.

In one aspect of the present invention, data packets can be compressed that can reduce the possibility of network congestion. The compressed packets can also increase loading at a link. Compressed packets may also have a lower latency. Furthermore, compressed packets may be stored as compressed packets, instead of being stored as decompressed packets, e.g. in a storage cache.

Although the present invention has been described with reference to specific embodiments these embodiments are illustrative only and not limiting. Many other applications and embodiments of the present invention will be apparent in light of this disclosure and the following claims.

What is claimed is:

1. A method for compressing an uncompressed data packet, comprising:
    (a) receiving the uncompressed data packet having a header portion and a data portion, the data portion having a plurality of bytes of data;
    (b) comparing a portion of the data portion with content stored in a history module; wherein a plurality of comparisons are performed with portions of the content stored in the history module and the portions of the content of the history module have a same byte size as the portion of the data portion;
    (c) generating a plurality of masks based on the plurality of comparisons with portions of the content stored in the history module, the generated masks indicative of a number of matches between the portion of the data portion of the data packet and portions of the content stored in the history module;
    (d) comparing the plurality of masks;
    (e) selecting one of the plurality of masks, based on the number of matches; and
    (f) generating a compression record for the portion of the data portion, wherein the compression record includes a plurality of fields indicating (i) a byte size of the portion of the data portion compared in step (b); (ii) an address field indicative of the selected mask in step (e); (iii) mask field indicative of the selected mask; and (iv) data indicative of an unmatched portion of the portion of the data portion; and
    (g) assembling a compressed data packet with a header and the compression record, wherein the header includes a control bit indicating the data packet is compressed.

2. The method of claim 1, wherein a mask indicative of maximum number of matches between the portion of the data portion and the portion of the content stored in the history module is selected.

3. The method of claim 1, wherein the history module includes a register to store the content.

4. The method of claim 1, wherein the history module content is updated by discarding an oldest number of bytes equal to a size of the portion of the data portion and appending the portion of the data portion.

5. The method of claim 1, wherein the data packet header includes information for decompressing compressed data.

6. The method of claim 1, wherein the uncompressed data packet is received from a host system.

7. The method of claim 1, wherein a compare module performs the comparison between the data portion of the data packet and the history module content; and a compression engine generates the compression record.

8. The method of claim 7, wherein the compare module and the compression engine are included in a host bus adapter.

9. The method of claim 7, wherein the compare module and the compression engine are included in a host channel adapter.

10. The method of claim 7, wherein the compare module and the compression engine are included in a network adapter.

11. A compression module for compressing an uncompressed data packet, comprising:
    an input buffer for receiving the uncompressed data packet, the uncompressed data packet having a header portion and a data portion, the data portion having a plurality of bytes of data;

a compare module for comparing a portion of the data portion of the data packet with content stored in a history module; wherein a plurality of comparisons are performed with portions of the content stored in the history module and the portions of the content having a same byte size as the portion of the data portion; and generating a plurality of masks based on the plurality of comparisons, the generated masks indicative of matches between the portion of the data portion and portions of the content stored in the history module; and a compression engine for (a) comparing the plurality of masks and selecting one of the plurality of masks, based on a match; (b) generating a compression record for the portion of the data portion, wherein the compression record includes fields indicative of; (i) a byte size of the portion of the data portion compared by the compare module, (ii) an address field indicative of the selected mask selected by the compression engine, (iii) a mask field indicative of the selected mask and (iv) data indicative of any unmatched portions of the portion of the data portion that is compared with portions of the content stored in the history module; and (c) assembling a compressed data packet with a header and the compression record, wherein the header includes a control bit indicating that the data packet is compressed.

12. The compression module of claim 11, wherein a mask indicative of a maximum number of the matches between the portion of the data portion of the data packet and portion of the content stored in the history module is selected.

13. The compression module of claim 11, wherein the history module includes a register to store the content.

14. The compression module of claim 11, wherein the history module content is updated by discarding an oldest number of bytes equal to a size of the portion of the data portion and appending portion of the data portion.

15. The compression module of claim 11, wherein the data packet header includes information for decompressing compressed data.

16. The compression module of claim 11, wherein the uncompressed data packet is received front a host system.

17. The compression module of claim 11, wherein the compression module is included in a host bus adapter.

18. The compression module of claim 11, wherein the compression module is included in a host channel adapter.

19. The compression module of claim 11, wherein the compression module is included in a network adapter.

20. A method for decompressing a data packet, comprising:

receiving a data packet, the data packet having a header portion and a data portion;

determining if the data portion of the data packet is compressed;

retrieving a compression record, if the data portion of the data packet is compressed, wherein the compression record includes fields indicative of a byte size of a portion of the data portion, an address field indicative of a selected mask, a mask field indicative of the selected mask and data indicative of unmatched portions of the portion of the data portion;

extracting data that had matches using the address field and mask field; and merging matched data with unmatched portions of the portion of the portion of the data portion for generating a portion of the data portion of a decompressed packet.

21. The method of claim 20, wherein a control bit value in the header portion of the data packet indicates if the data packet is compressed.

22. The method of claim 20, wherein a control byte is used to determine a mask size and an address size.

* * * * *

UNITED STATES PATENT AND TRADEMARK OFFICE
CERTIFICATE OF CORRECTION

PATENT NO. : 7,643,505 B1  Page 1 of 2
APPLICATION NO. : 11/565444
DATED : January 5, 2010
INVENTOR(S) : Ian G. Colloff It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 385 days.

On sheet 2 of 10, in FIG. 1C, Above Reference Numeral 122, line 1, delete "Un-compressed" and insert -- Uncompressed --, therefor.

On sheet 7 of 10, in FIG. 4E, Reference Numeral 407, line 1-2, delete "Indicat or bit" and insert -- Indicator bit --, therefor.

In column 1, line 7-8, delete "particularly" and insert -- particularly, --, therefor.

In column 2, line 2, delete "Figures:" and insert -- figures: --, therefor.

In column 2, line 63, delete "system" and insert -- system. --, therefor.

In column 3, line 1, delete "(20))" and insert -- (20)), --, therefor.

In column 3, line 6, delete "25" and insert -- 26 --, therefor.

In column 4, line 10, delete "(12)." and insert -- (122). --, therefor.

In column 4, line 42, delete "X %" and insert -- X% --, therefor.

In column 5, line 9, delete "110" and insert -- 120 --, therefor.

In column 5, line 34, delete "(Nbyte0=4" and insert -- ($Nbyte_0$=4 --, therefor.

Signed and Sealed this

Nineteenth Day of October, 2010

David J. Kappos
*Director of the United States Patent and Trademark Office*

In column 5, line 41, delete "X0, X1, X2" and insert -- $X_0, X_1, X_2$ --, therefor.

In column 5, line 45, delete "$X_O$" and insert -- $X_0$ --, therefor.

In column 6, line 1, delete "$X_O$" and insert -- $X_0$ --, therefor.

In column 6, line 3, delete "$X_O$" and insert -- $X_0$ --, therefor.

In column 6, line 46, delete "CPC" and insert -- CRC --, therefor.

In column 6, line 59, delete "address" and insert -- address, --, therefor.

In column 7, line 66, delete "embodiments" and insert -- embodiments, --, therefor.

In column 8, line 28, in claim 1, delete "(iii)" and insert -- (iii) a --, therefor.

In column 9, line 15, in claim 11, delete "of;" and insert -- of --, therefor.

In column 10, line 5, in claim 16, delete "front" and insert -- from --, therefor.

In column 10, line 27-28, in claim 16, delete "of the portion of the portion" and insert -- of the portion --, therefor.

UNITED STATES PATENT AND TRADEMARK OFFICE
CERTIFICATE OF CORRECTION

PATENT NO. : 7,643,505 B1 Page 1 of 1
APPLICATION NO. : 11/565444
DATED : January 5, 2010
INVENTOR(S) : Ian G. Colloff It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 385 days.

Signed and Sealed this

Sixteenth Day of November, 2010

David J. Kappos
*Director of the United States Patent and Trademark Office*